US012573521B2

(12) United States Patent
Wang et al.

(10) Patent No.: US 12,573,521 B2
(45) Date of Patent: Mar. 10, 2026

(54) ELASTOMERIC CONDUCTIVE COMPOSITE INTERCONNECT

(71) Applicant: TE Connectivity Solutions GMBH, Schaffhausen (CH)

(72) Inventors: Lei Wang, San Jose, CA (US); Megan Hoarfrost Beers, Redwood City, CA (US); Ting Gao, Palo Alto, CA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 288 days.

(21) Appl. No.: 18/078,157

(22) Filed: Dec. 9, 2022

(65) Prior Publication Data
US 2023/0120567 A1 Apr. 20, 2023

Related U.S. Application Data

(62) Division of application No. 16/788,228, filed on Feb. 11, 2020, now abandoned.

(51) Int. Cl.
*H01B 1/22* (2006.01)
*C08L 83/04* (2006.01)
*H05K 1/09* (2006.01)

(52) U.S. Cl.
CPC ............... *H01B 1/22* (2013.01); *C08L 83/04* (2013.01); *H05K 1/09* (2013.01); *C08L 2203/20* (2013.01); *C08L 2205/025* (2013.01); *C08L 2205/18* (2013.01); *C08L 2312/00* (2013.01)

(58) Field of Classification Search
CPC ....................................................... H01B 1/22
See application file for complete search history.

(56) References Cited

U.S. PATENT DOCUMENTS

| | | | |
|---|---|---|---|
| 4,128,673 A | 12/1978 | Watanabe et al. | |
| 5,458,937 A | 10/1995 | Nakamura et al. | |
| 5,904,978 A | 5/1999 | Hanrahan et al. | |
| 6,271,482 B1 * | 8/2001 | Crotzer ................. | H05K 3/325 |
| | | | 174/262 |

(Continued)

FOREIGN PATENT DOCUMENTS

CN 104098834 B 10/2014

OTHER PUBLICATIONS

Shore A Hardness Scale conversion chart (Year 2022).

(Continued)

*Primary Examiner* — William D Young

(57) ABSTRACT

A moldable interconnect device for providing an electrical connection between two or more opposing arrays of contacts for establishing an electrical circuit. The moldable interconnect device having an insulting substrate and an array of conductive elements held in the insulating substrate, the conductive elements are made of an elastomeric conductive composite. The composite having a polymeric matrix comprising a crosslinked polymer. The polymer having a curing agent for catalyzing crosslinking of the polymer matrix and conductive metal particles and non-conductive compressible rubber particles dispersed with the polymer matrix. The non-conductive compressible rubber particles having a greater compressibility than the elastomeric conductive composite that is the same as the elastomeric conductive composite but free of non-conductive compressible rubber particles.

15 Claims, 2 Drawing Sheets

(56)       References Cited

U.S. PATENT DOCUMENTS

| | | | | |
|---|---|---|---|---|
| 6,558,577 B1 * | 5/2003 | Niihara | .................... | H01B 1/24 |
| | | | | 252/511 |
| 6,652,968 B1 * | 11/2003 | Miller | ...................... | H01B 1/22 |
| | | | | 428/407 |
| 8,550,825 B2 | 10/2013 | Mason et al. | | |
| 2005/0239940 A1 * | 10/2005 | Shima | .................... | C08L 83/04 |
| | | | | 524/439 |

OTHER PUBLICATIONS

First Office Action from the CNIPA dated Jul. 18, 2023 (with English translation thereof) corres. to Appln. No. 202110182951.5, 11 pp.

\* cited by examiner

ELASTOMERIC CONDUCTIVE COMPOSITE INTERCONNECT

CROSS REFERENCE TO RELATED APPLICATIONS

This application is a Divisional of and claims priority to U.S. application Ser. No. 16/788,228 filed on Feb. 11, 2020 which is incorporated herein by reference in its entirety.

BACKGROUND OF THE INVENTION

Field of the Invention

The present invention generally relates to an improved elastomeric conductive composite for use in a moldable interconnect.

Introduction to the Invention

Interconnect devices are used to provide electrical connection between two or more opposing contacts or arrays of contacts for establishing at least one electrical circuit, where the respective arrays may be provided on a silicon package, an electronic device, a printed circuit board or similar solutions. In one interconnect technique, the electrical connection is provided by an interconnect device that is physically interposed between corresponding electrical contacts of the opposing arrays of contacts.

Some known interconnect devices use an array of conductive elastomeric columns supported on a substrate, columns which may be compressed to establish reliable contact and provide the electrical connection between the opposing contacts. In other known interconnect devices, the elastomeric columns are non-conductive and the electrical connection is provided via a separate contact or trace.

Conductive elastomers offer several advantages as materials for interconnect devices, for socketing high speed silicon packages. They are moldable and easily formed into custom patterns with inexpensive tooling. Furthermore, it is possible to achieve small pitches and contact heights, as small as 0.5 mm for each, and perhaps smaller. The contact resistance of molded contacts can be very low, <15 mΩ/pin, and the signal integrity is excellent compared to metal contacts. For all of these reasons, they are sought out for various applications, especially for those that generally require low volumes of custom patterns along with excellent electrical performance.

U.S. Pat. No. 6,271,482 (David R. Crotzer et al.), discloses several types of electrical interconnects based on conductive elastomers formed of a non-conductive elastic material, having a quantity of conductive flakes and conductive powder granules dispersed therein.

U.S. Pat. No. 7,726,976 and U.S. Publication Nos. 2012/0257366A1 and 2012/0258616A1 offer further examples of metallized-particle interconnects (MPI) devices also based on conductive elastomers.

However, the material requirements for moldable interconnects are very challenging. Very low contact resistance must be coupled with excellent mechanical properties and processability. Specifically, the materials must have good compressibility, especially for large arrays, to compensate for the imperfect flatness of the substrates between which they are compressed. In addition, they must maintain their performance for long times under compression and heat exposure, meaning the polymer chains in the elastomer must have minimal relaxation. As well, they must be molded into contact array geometries with good mold release properties.

In the past, alternative silicone materials have been compounded with conductive metal particles to meet these challenging mechanical and electrical requirements. The resulting conductive composites can be molded into contact arrays. However, the forces needed to compress the contact arrays are larger than desired, and the durability of the contact arrays is less than desired due to the creep and relaxation performance of the material. Furthermore, the material formulations and geometries that can be molded are limited by the mold release properties of the materials.

U.S. Pat. No. 5,904,978 discloses an electrically conductive composite article which is continuously conductive throughout the structure of the material and is therefore suitable for applications such as EMI shielding requiring a flexible and conformable material. The composite comprises electrically conductive particles and electrically nonconductive expanded hollow polymeric particles. However, the resulting composite is deformable under a low compression load. Additionally, the composite described is solvent-processed and cannot be molded.

Several approaches have been tried such as adjusting the crosslinking density of the conductive composites. The compressibility of the conductive composites can be improved by reducing the crosslinking density. Still, the creep and relaxation performance of conductive composites becomes worse as the crosslinking density is reduced.

Thus, new approaches are needed to improve the compressibility of the conductive composites without deteriorating other properties such as creep resistance, relaxation resistance, compressibility, processability and contact resistance.

BRIEF SUMMARY OF THE INVENTION

The present invention relates to an elastomeric conductive composite for use in a moldable interconnect, said composite comprising a polymeric matrix comprising a crosslinked polymer, a curing agent for catalyzing crosslinking of the polymeric matrix, conductive metal particles and nonconductive compressible rubber particles dispersed within the polymeric matrix, the nonconductive compressible rubber particles having a greater compressibility than an elastomeric conductive composite that is the same as the elastomeric conductive composite but is free of non-conductive compressible rubber particles. The polymeric matrix can be filled with a high loading of conductive and non-conductive particles by conventional mixing technologies. The resulting composite offers the advantage that the amount of compression at a given normal force is greater for this formulation comprising nonconductive compressible rubber particles when compared to a similar formulation without such nonconductive compressible rubber particles. The addition of soft compressible rubber particles into the conductive composite allows excellent compressibility while maintaining other key properties of the conductive composite. While soft rubber particles have been used in the past to improve impact resistance, tactile softness, light diffusion, and many other material characteristics, in this invention the good compressibility of soft rubber particles is used to improve the compressibility of conductive composites. The resulting composite is also easy to manufacture into an interconnect device.

According to a further embodiment, a moldable interconnect is provided comprising the elastomeric conductive composite as described above.

In a further embodiment, the use of the moldable interconnect is provided for an electrical interconnect device used to provide electrical connection between two or more opposing arrays of contacts for establishing at least one electrical circuit.

Accordingly, the primary object of the present invention is to provide an elastomeric conductive composite with very low contact resistance and good mechanical properties. It is also an object of the present invention to provide an improved moldable interconnect comprising the elastomeric conductive composite and the use of the moldable interconnect for an electrical interconnect device.

The above primary object as well as other objects, features and advantages of the present invention will become readily apparent from the following detailed description which is to be ready in conjunction with the appended drawings.

DETAILED DESCRIPTION OF THE INVENTION

Figure 1:
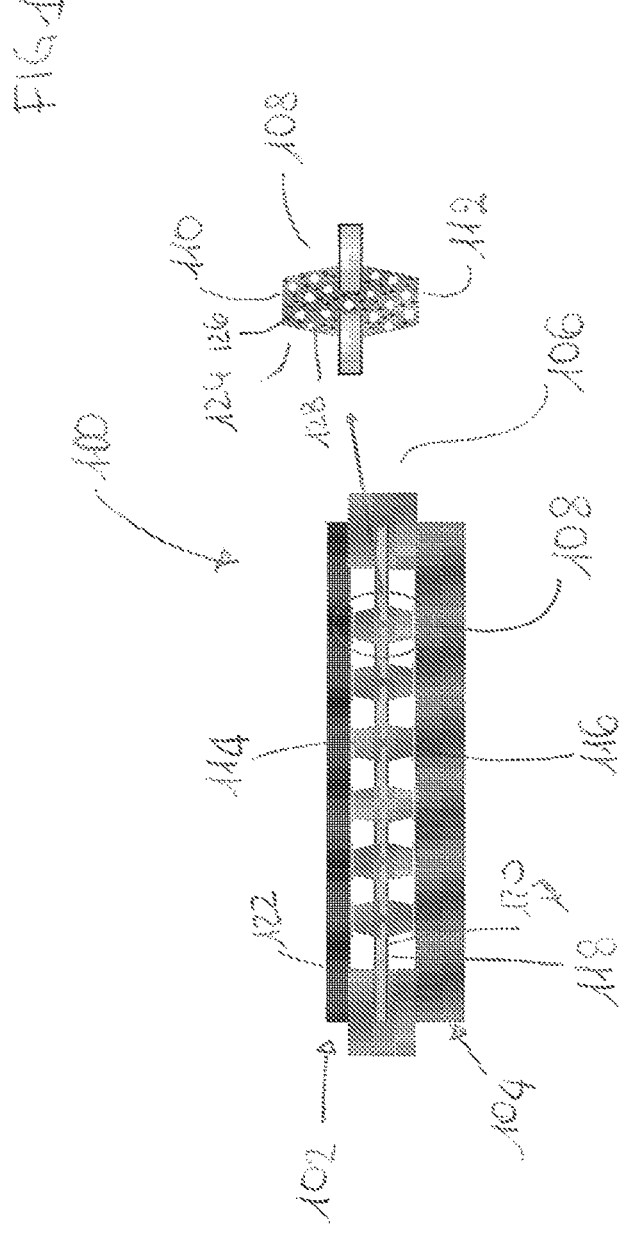
FIG. 1 illustrate an electrical interconnect system.

In the present invention, an elastomeric conductive composite for use in a moldable interconnect is provided which comprises a polymeric matrix comprising a crosslinked polymer, a curing agent for catalyzing crosslinking of the polymeric matrix, conductive metal particles and nonconductive compressible rubber particles dispersed within the polymeric matrix. The nonconductive compressible rubber particles have a greater compressibility than an elastomeric conductive composite that is the same as the elastomeric conductive composite but is free of non-conductive compressible rubber particles.

Such a material may be effectively employed in a variety of useful applications including moldable interconnect devices for the data connection industry or socketing high speed silicon packages where traditional structures struggle to support the signal integrity performance requirements.

In general, a polymeric matrix material includes a polymerization product of one or more monomers and a crosslinking agent. The polymeric matrix of the present invention comprises an elastomeric crosslinked polymer. Examples of polymers useful as a matrix for the elastomeric composite of the present invention include silicone, fluorosilicone, fluoroelastomer, epoxy, ethylene propylene diene monomer rubber (EPDM), polyolefin (PO), or polyurethane (PU). A silicone matrix offers the advantage of providing an excellent combination of strength, elasticity, performance over wide temperature range.

In a further embodiment, the polymeric matrix that comprises an elastomeric crosslinked polymer, before adding conductive metal particles or nonconductive compressible rubber particles, has a Shore A hardness of more than 20, so as to ensure that after the addition of the metal particles, required mechanical properties, e.g., the balance between mechanical strength, compressibility and creep and relaxation resistance, are obtained. The Shore A hardness of the polymeric matrix before mixing with the conductive metal particles should be of more than 20, preferably more than 30 and most preferable comprised between 40 to 90.

The catalyzing agent, which can also equivalently be called curing agent or hardener, functions as a catalyst to facilitate the bonding of the molecular components of the material, and can for example be a catalyst such as a peroxide, platinum, or tin catalyst.

The polymeric matrix can take a high loading of conductive metal particles by standard mixing technologies, such as batch, roller, or centrifugal mixing. The high loading is such as to exceed the percolation threshold of the conductive metal particles.

According to another aspect of the present invention the conductive metal particles should have very low electrical resistivity and good stability to heat and humidity. Preferred conductive particles include silver, nickel, aluminum, platinum, copper, stainless steel, carbon, and gold. The particles may comprise a metal coating to enhance conductivity. Preferred metal coatings include silver, nickel, copper, and gold. Most preferred are particles selected from the group consisting of silver, silver coated particles such as silver-coated glass, silver-coated copper, silver-coated nickel, silver-coated aluminum, gold, and gold coated particles.

The conductive metal particles should be small so that they can form conductive networks in small form factors. The average size should desirably be less than 50 $\mu$m, particularly less than 40 $\mu$m, more preferably less than 30 $\mu$m, especially less than 20 $\mu$m, most preferably less than 12 $\mu$m with the advantage that a good conductivity in small geometries (the resulting contact pins are generally <1 mm in diameter) is obtained and also maintained after environmental conditioning such as heat, heat/humidity, etc.

The conductive metal particles may be a blend of multiple types of morphologies and shapes to facilitate higher conductivity. For example, they can be spherical, flakes, granules, fibers, layers, or other shapes, and combinations of these.

In one embodiment of the present invention, the concentration of the conductive metal particles is 15 vol % to 40 vol %, preferably more than 20%, more preferably 20 vol % to 35 vol %, more preferably 30 vol % to 35 vol %, more preferably 20 vol % to 30 vol %, more preferably 25 vol % to 30 vol %, more preferably 20 vol % to 25 vol % of the polymer matrix. Those ranges of concentrations allow achieving a percolated network of conductive particles without sacrificing processability.

According to another improvement of the invention, preferred nonconductive compressible rubber particles (also called soft rubber particles) to be dispersed within the polymeric matrix are silicone particles or silicone microspheres. The soft rubber particles can be in the form of spheres, microspheres, powders, flakes, tubes, cubes, ellipsoids and any other shape or morphology which makes them suitable to be mixed in the polymeric matrix. Available microspheres are essentially ball-shaped particles adapted to be deformed under the action of a certain pressure. The microspheres can be easily deformed by pressure and recover their shape after the release of pressure, so that when distributed within the matrix this will have an impact on the mechanical behavior of the resulting composite.

The nonconductive compressible rubber particles have an average size of 0.1 to 1000 $\mu$m, preferably from 1 $\mu$m to 100 $\mu$m, more preferably from 5 $\mu$m to 30 $\mu$m. The size needs to be small enough not to disrupt conductive network of metal particles in the contact array geometry (contacts are generally <100 um in diameter) or negatively impact the mechanical integrity but also large enough to provide compressibility benefit.

The concentration of the nonconductive compressible rubber particles should be below the upper limit that would destroy the conductive network and/or the mechanical integrity and geometry of the conductive composite so to maintain mechanical integrity and conductivity, while should also be such as to optimize the moldability and mold release properties and reduce flash. The concentration should be 1 vol % to 60 vol % of the elastomeric conductive composite, should preferably be from 1 vol % to 20 vol % of the total conductive composite, most preferably from 5 vol % to 10 vol %, or from 20 vol % to 60 vol %, more preferably from 20 vol % to 50 vol %, more preferably from 25 vol % to 35 vol %, most preferably from 30 vol % to 40 vol %. Specifically, when using a concentration of 5% to 10%, small pins of conductive composite which are ~0.7 mm tall and ~0.3 mm wide can be obtained.

The nonconductive compressible rubber particles have a greater compressibility than an elastomeric conductive composite that is the same as the elastomeric conductive composite as described above but is free of non-conductive compressible rubber particles. The good compressibility of soft rubber particles allows improving the compressibility of the conductive composite. It is understood that the term compressibility can be defined as the % that the height of an element is reduced under 40 g compressive force.

When the elements, for example pillars that are 1.1 mm tall with center diameters of 0.66 mm and top/bottom diameters of 0.46 mm, are made of elastomeric conductive composite comprising at least 20 vol % of nonconductive compressible rubber particles, the compressibility of the elements is increased by at least 10% at a given applied force compared to the compressibility of the elements made of an elastomeric conductive composite that is free of non-conductive compressible rubber particles.

In order to form a conductive array, into the polymeric matrix a desired amount of nonconductive compressible rubber particles and the catalytic agent are added and mixed uniformly. The desired amount of conductive particles is then added and mixed uniformly. The elastomeric conductive composite can be then molded into a conductive array which is made up of pillars for example each roughly 1.14 mm tall with center diameters of 0.66 mm and top/bottom diameters of 0.46 mm and then the compressibility can be tested on a texture analyzer or dynamic mechanical analyzer. The conductive array can also have different geometries, while the pillars can also have different heights and diameters.

Mixing may occur by any suitable means including dry blending of powders, wet blending, centrifugal mixing, compounding, roll milling, etc.

FIG. 1 illustrates a moldable interconnect 100 comprising an interconnect device 106 made of the elastomeric conductive composite comprising the polymeric matrix 124, conductive metal particles 126 and non-conductive compressible rubber particles 128 dispersed within the polymeric matrix in accordance with an exemplary embodiment. Interconnect devices such as the one depicted in FIG. 1 may be a board-to-board, board-to-device, or device-to-device type of interconnect device, and are used to provide electrical connection between two or more opposing arrays of contacts for establishing at least one electrical circuit, where the arrays may be provided on a silicon package, an electronic device, a printed circuit board or the like. In particular, FIG. 1 is a cross sectional view of a portion of an interconnect device 106 interconnecting the electrical components 102 and 104 of the moldable interconnect. For example, electrical component 104 may be a circuit board, and electrical component 102 is an electronic package such as a chip or processor, while interconnect device 106 can be a socket mounted to the circuit board and configured to receive the chip. The first electrical component 102 and second electrical component 104 are shown in a mated state. In an exemplary embodiment, the interconnect device 106 includes a plurality of compressible pillars 108 of elastomeric conductive composite arranged in and held in a contact array of elements. The wording 'pillars' should be interpreted to have the same meaning of 'elements' 'columns' or 'pins' and it's used to describe the molded contact shape, which is frustoconical with a center diameter in correspondence of a wider mid-section and with top/bottom diameters in correspondence of narrower opposite first end 110 and second end 112. The pillars 108 within the array are arranged in a predetermined pattern. The pillars 108 have opposite first ends 110 and second ends 112 with the pillars being conductive between the first and second ends. The interconnect device 106 is mounted to the second electrical component 104 such that the first end 110 of each elastomeric column 108 engages the mating contact 114 provided on the first electrical component 102, while the second end 112 of each elastomeric column 108 engages the mating contact 116 provided on the second electrical component 104. In other alternative embodiments, the interconnect device 106 may be secured to the second electrical component 104, such as by using latches, fasteners or other means to mechanically hold the interconnect device 106 on the second electrical component 104.

The array of elements or elastomeric pillars 108, is held in an insulating substrate 118. The pillars 108 may be molded or otherwise disposed within the insulating substrate 118. The insulating substrate has opposite first and second outer surfaces, the first and second outer surfaces 120 and 122 being planar and parallel to each other.

In an enlarged view, a detail of each column is shown, with the elastomeric conductive composite being illustrated as a polymeric matrix 124 comprising, dispersed within, conductive metal particles 126 and non-conductive compressible rubber particles 128.

Other examples of application for interconnect devices next to connectors are sockets or interposers. Examples of other applications of the elastomeric conductive composite are electromagnetic interference (EMI) shielding gaskets, tubing and cable jacket products.

The following procedure was used to determine the properties of the material created in the following example:

Example

Figure 2:
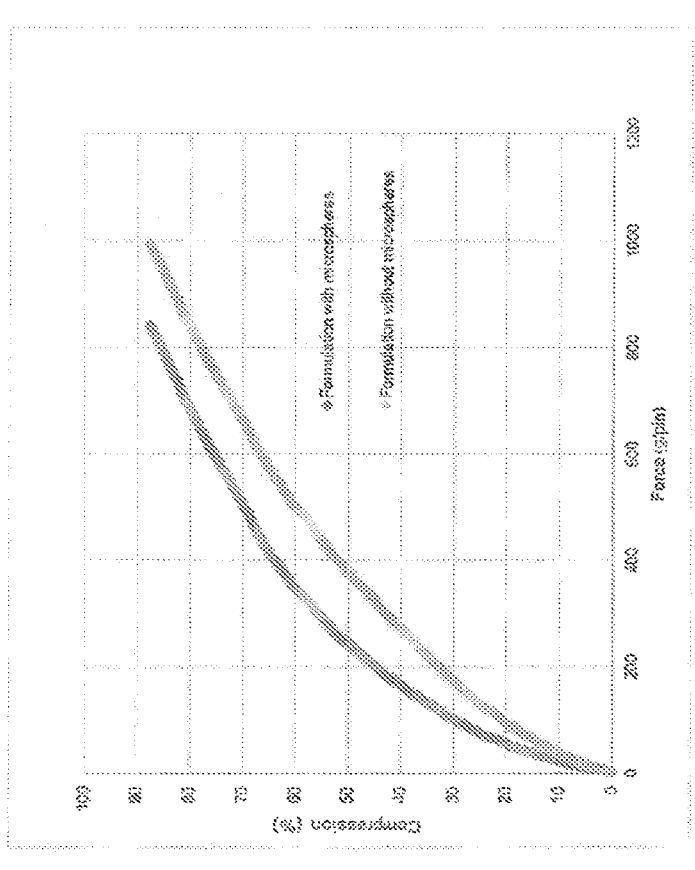
FIG. 2 is a graph of compression (%) v. force (g/pin) depicting the results of testing performed on a texture analyzer for two embodiments of the moldable interconnect article of the present invention

Two formulations were prepared based on a silicone polymeric matrix. In the first formulation 30 vol % (total, based on the final formulation composition) silicone microspheres with average diameter 30 μm were added and mixed uniformly using a centrifugal mixer. In the second formulation no microspheres were added. Then, in both, 25 vol % (with respect to the amount of silicone) silver-coated copper powder was added and mixed in uniformly. The compounds were then molded into conductive array samples made up of pillars roughly 1.14 mm tall, with center diameters of roughly 0.66 mm and top/bottom diameters of roughly 0.46 mm. The conductive array samples were then tested on a texture analyzer. As shown in FIG. 2, the amount of compression at a given normal force was greater for the formulation with microspheres compared to the formulation without. When the samples were made of an elastomeric conductive composite comprising at least 25 vol % of non-conductive compressible rubber particles, the compressibility of the elements was increased by at least 10% at a given applied force compared to the compressibility of the elements made of a similar elastomeric conductive composite not containing non-conductive compressible rubber particles. The compressibility is defined as the % that the height of an element is reduced under a 40 g compressive force. The molded pillars made with the formulation with microspheres have only a slightly higher resistance of 241 mOhm/pin, compared to 75 mOhm/pin for the pillars made with the formulation without microspheres. The resistance through each pillar is less than 1 Ohm. The resistance was measured from the top to the bottom of a pillar, and includes the contact resistance with flat, gold-plated electrodes.

A further formulation was prepared based on a silicone polymeric matrix, in which 5 vol % (total, based on the final formulation composition) silicone microspheres with average diameter 5 μm were added and mixed uniformly. In this case, 0.69 mm tall elements with center diameters of 0.24 mm and top/bottom diameters of 0.17 mm were obtained which could easily be released from the mold, indicating an improvement in the moldability compared to a similar formulation without silicone microspheres. The flash between pins that resulted from the molding process was reduced compared to a similar formulation without silicone microspheres.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A moldable interconnect device for providing an electrical connection between two or more opposing arrays of contacts for establishing an electrical circuit, the moldable interconnect device comprising:

an insulting substrate;

an array of conductive elements held in the insulating substrate, wherein the conductive elements are made of an elastomeric conductive composite, the composite comprising:

a polymeric matrix comprising a crosslinked polymer;

a curing agent for crosslinking of the polymer matrix, and conductive metal particles and non-conductive compressible rubber particles dispersed with the polymer matrix, the non-conductive compressible rubber particles having a greater compressibility than the elastomeric conductive composite that is the same as the elastomeric conductive composite but free of non-conductive compressible rubber particles.

2. The moldable interconnect device as recited in claim 1, wherein the conductive elements are pillars having opposite first and second ends, the pillars being conductive between the first and second ends.

3. The moldable interconnect device as recited in claim 2, wherein the resistance through each pillar is less than 1 Ohm.

4. The moldable interconnect device as recited in claim 2, wherein the insulating substrate has opposite first and second outer surfaces, the first and second outer surfaces being planar and parallel to each other.

5. The moldable interconnect device as recited in claim 2, wherein the conductive elements are made of elastomeric conductive composite comprising at least 20 vol % of non-conductive compressible rubber particles.

6. The moldable interconnect device as recited in claim 1, wherein the crosslinked polymer comprises an elastomer.

7. The moldable interconnect device as recited in claim 1, wherein the polymeric matrix comprises silicone.

8. The moldable interconnect device as recited in claim 1, wherein the polymeric matrix has a Shore A hardness of more than 20.

9. The moldable interconnect device as recited in claim 1, wherein the conductive metal particles are selected from the group consisting of silver, silver coated particles, gold, and gold coated particles.

10. The moldable interconnect device as recited in claim 1, wherein the conductive metal particles have an average size of less than 50 μm.

11. The moldable interconnect device as recited in claim 1, wherein the concentration of the conductive metal particles is 15 vol % to 40 vol % with respect to the polymer matrix.

12. The moldable interconnect device as recited in claim 1, wherein the non-conductive compressible rubber particles comprise silicone microspheres.

13. The moldable interconnect device as recited in claim 1, wherein the non-conductive compressible rubber particles have an average size of 0.1 to 1000 μm.

14. The moldable interconnect device as recited in claim 1, wherein the concentration of the non-conductive compressible rubber particles in the elastomeric conductive composite is of 1 vol % to 20 vol %.

15. The moldable interconnect device as recited in claim 1, wherein the concentration of the non-conductive compressible rubber particles in the elastomeric conductive composite is of 20 vol % to 60 vol %.

* * * * *